(12) United States Patent
Kwon

(10) Patent No.: US 11,416,174 B2
(45) Date of Patent: Aug. 16, 2022

(54) MEMORY DEVICE AND METHOD OF OPERATING THE SAME

(71) Applicant: SK hynix Inc., Gyeonggi-do (KR)

(72) Inventor: Chan Keun Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 36 days.

(21) Appl. No.: 16/886,281

(22) Filed: May 28, 2020

(65) Prior Publication Data
US 2021/0157526 A1 May 27, 2021

(30) Foreign Application Priority Data
Nov. 21, 2019 (KR) .......... 10-2019-0150506

(51) Int. Cl.
| | | |
|---|---|---|
| G11C 16/32 | (2006.01) | |
| G11C 7/04 | (2006.01) | |
| G11C 16/06 | (2006.01) | |
| G06F 3/06 | (2006.01) | |
| G11C 16/04 | (2006.01) | |

(52) U.S. Cl.
CPC .......... *G06F 3/0659* (2013.01); *G06F 3/0604* (2013.01); *G06F 3/0653* (2013.01); *G11C 7/04* (2013.01); *G11C 16/32* (2013.01); *G11C 16/0483* (2013.01); *G11C 16/06* (2013.01)

(58) Field of Classification Search
CPC .... G06F 3/0604; G06F 3/0659; G06F 3/0653; G11C 7/04; G11C 16/32
See application file for complete search history.

(56) References Cited

U.S. PATENT DOCUMENTS

| | | | | |
|---|---|---|---|---|
| 9,614,258 | B2 * | 4/2017 | Takahashi | H01M 10/48 |
| 2014/0032949 | A1 * | 1/2014 | Kim | G05D 23/1919 713/322 |
| 2015/0301744 | A1 * | 10/2015 | Kim | G06F 3/0616 711/103 |
| 2015/0332780 | A1 * | 11/2015 | Jang | G11C 16/0483 365/185.18 |
| 2016/0033976 | A1 * | 2/2016 | Jung | G11C 16/26 700/299 |
| 2016/0306592 | A1 * | 10/2016 | Oh | G11C 16/0483 |
| 2019/0018611 | A1 * | 1/2019 | Kim | G06F 3/0653 |
| 2019/0286442 | A1 * | 9/2019 | Takizawa | G06F 11/1048 |
| 2019/0371412 | A1 * | 12/2019 | Lee | G11C 16/26 |

FOREIGN PATENT DOCUMENTS

| | | |
|---|---|---|
| KR | 10-2015-0137250 | 12/2015 |
| KR | 10-2016-0122911 | 10/2016 |

\* cited by examiner

*Primary Examiner* — Anthan Tran
(74) *Attorney, Agent, or Firm* — IP & T Group LLP

(57) ABSTRACT

The present disclosure relates to a semiconductor system including a semiconductor device and a controller. The semiconductor device outputs a temperature code corresponding to an internal temperature thereof. The controller controls, based on the temperature code, the semiconductor device to set a temperature measurement mode among at least two temperature measurement modes having different temperature measurement periods and to measure the internal temperature in the set temperature measurement mode.

23 Claims, 18 Drawing Sheets

FIG. 7

FIRST TEMPERATURE CODE TABLE

| Temperature(°C) | # of pulses | Temp Code |
|---|---|---|
| 50 | 0 | 000 |
| 52.5 | 1 | 001 |
| 55 | 2 | 010 |
| 57.5 | 3 | 011 |
| 60 | 4 | 100 |
| 62.5 | 5 | 101 |
| 65 | 6 | 110 |
| 67.5 | 7 | 111 |

SECOND TEMPERATURE CODE TABLE

| Temperature(°C) | # of pulses | Temp Code |
|---|---|---|
| 70 | 0 | 0000 |
| 71.25 | 1 | 0001 |
| 72.5 | 2 | 0010 |
| 73.75 | 3 | 0011 |
| 75 | 4 | 0100 |
| 76.25 | 5 | 0101 |
| 77.5 | 6 | 0110 |
| 78.75 | 7 | 0111 |
| 80 | 8 | 1000 |
| 81.25 | 9 | 1001 |
| 82.5 | 10 | 1010 |
| 83.75 | 11 | 1011 |
| 85 | 12 | 1100 |
| 86.25 | 13 | 1101 |
| 87.5 | 14 | 1110 |
| 88.75 | 15 | 1111 |

THRESHOLD VALUE

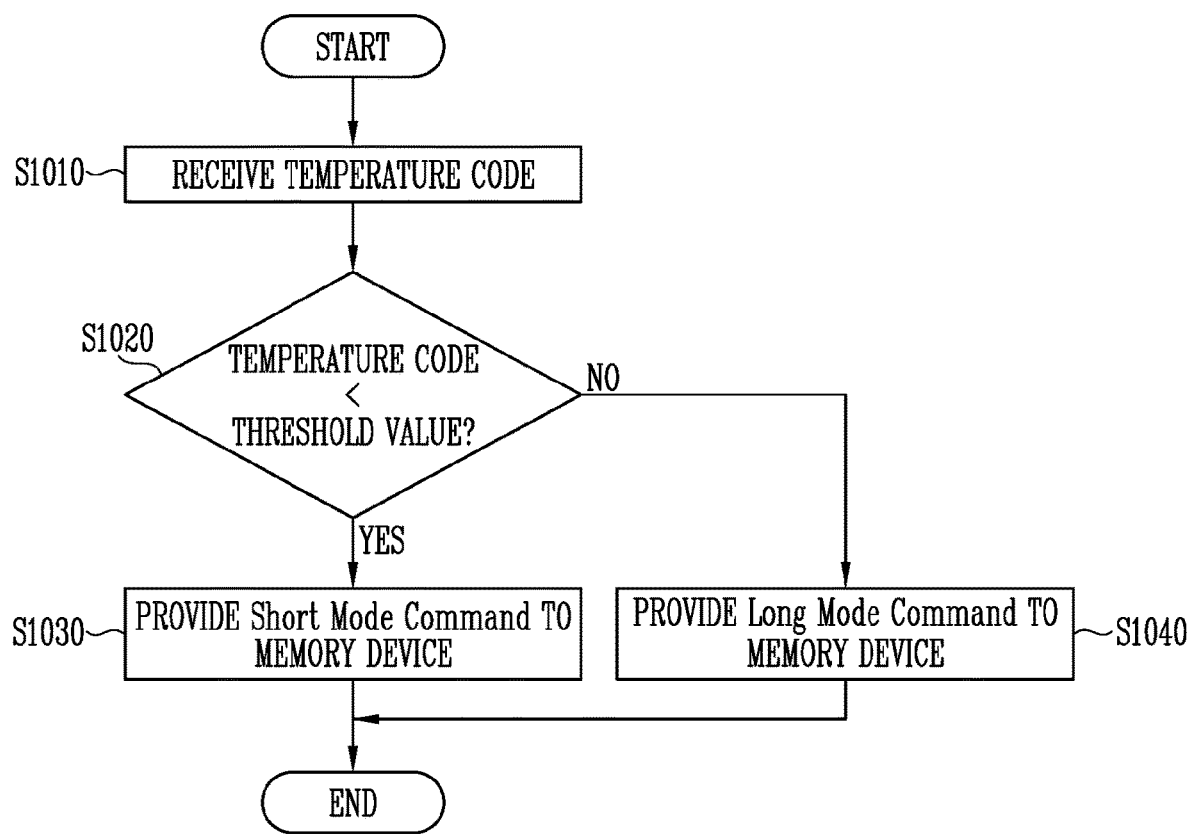

MEMORY DEVICE AND METHOD OF OPERATING THE SAME

CROSS-REFERENCE TO RELATED APPLICATION

The present application claims priority under 35 U.S.C. § 119(a) to Korean patent application number 10-2019-0150506, filed on Nov. 21, 2019, which is incorporated herein by reference in its entirety.

BACKGROUND

Field of Invention

The present disclosure relates to an electronic device, and more particularly, to a memory device and a method of operating the same.

Description of Related Art

A storage device stores data. A storage device includes a memory device in which data is stored and a memory controller controlling the memory device. A memory device is implemented using a semiconductor such as silicon (Si), germanium (Ge), gallium arsenide (GaAs), or indium phosphide (InP). A memory device may be a volatile memory device or a non-volatile memory device.

In a volatile memory device stored data is lost when power supply is cut off. A volatile memory device includes a static RAM (SRAM), a dynamic RAM (DRAM), a synchronous DRAM (SDRAM), and the like.

A non-volatile memory device maintains stored data even though power supply is cut off. A non-volatile memory device includes a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. A flash memory may be a NOR type or a NAND type.

A memory device may include parity that recovers data when an error occurs in read data.

SUMMARY

An embodiment of the present disclosure provides a storage device including a memory device including a temperature sensor operating in different modes, and a memory controller, and a method of operating the same.

A semiconductor system according to an embodiment of the present disclosure includes a semiconductor device configured to output a temperature code corresponding to an internal temperature thereof and a controller configured to control, based on the temperature code, the semiconductor device to set a temperature measurement mode among at least two temperature measurement modes having different temperature measurement periods and to measure the internal temperature in the set temperature measurement mode.

A storage device according to an embodiment of the present disclosure includes a memory device including a memory cell that stores data and configured to perform an operation on the memory cell, and a memory controller configured to control a length of a first period during which the operation is performed and a length of a second period during which a temperature measurement operation of measuring an internal temperature of the memory device is performed.

A memory device according to an embodiment of the present disclosure includes a memory cell array, and a temperature sensor configured to measure an internal temperature of the memory cell array and generate at least one pulse corresponding to the internal temperature, a pulse counter configured to evaluate the pulse and output pulse information corresponding thereto, a temperature code generator configured to generate a temperature code corresponding to the pulse information, and a mode register indicating an operation mode of the temperature sensor. The operation mode includes a short mode in which an operation time of the pulse counter is relatively short and a long mode in which the operation time of the pulse counter is relatively long, and the pulse counter counts the at least one pulse or measures a width of the pulse.

An operating method of a memory system including a controller and a memory device according to an embodiment of the present disclosure includes providing, by the memory device, the controller with information of a current temperature of the memory device and controlling, by the controller, the memory device to sense a subsequent temperature of the memory device in one among multiple different resolutions for a particular time duration among multiple different time durations based on the current temperature.

According to an embodiment of the present technology, a storage device including a memory device including a temperature sensor operating in different modes, and a memory controller, and a method of operating the same are provided.

BRIEF DESCRIPTION OF THE DRAWINGS

FIG. 7 is a diagram illustrating a temperature code table.

FIG. 10 is a flowchart describing a method of operating a memory controller according to an embodiment of the present disclosure.

DETAILED DESCRIPTION

The following description, with reference to the accompanying drawings, is directed to illustrating and describing various embodiments of the present invention. However, the present invention may be embodied in other forms, which may be variations of any of the disclosed embodiments. Thus, the present invention is not limited to or by any of the disclosed embodiments or any specific details.

Throughout the specification, reference to "an embodiment," "another embodiment" or the like is not necessarily to only one embodiment, and different references to any such phrase are not necessarily to the same embodiment(s). Also, an open-ended transition term, such as "comprising," "including" or the like, when used herein, does not preclude the existence or addition of one or more elements or operations in addition to those stated. Similarly, use of an indefinite article, i.e., "a" or "an," is intended to mean one or more, unless the context clearly indicates that only one is intended.

Hereinafter, embodiments of the present disclosure are described with reference to the accompanying drawings to enable those skilled in the art to make and use the present invention.

Figure 1:
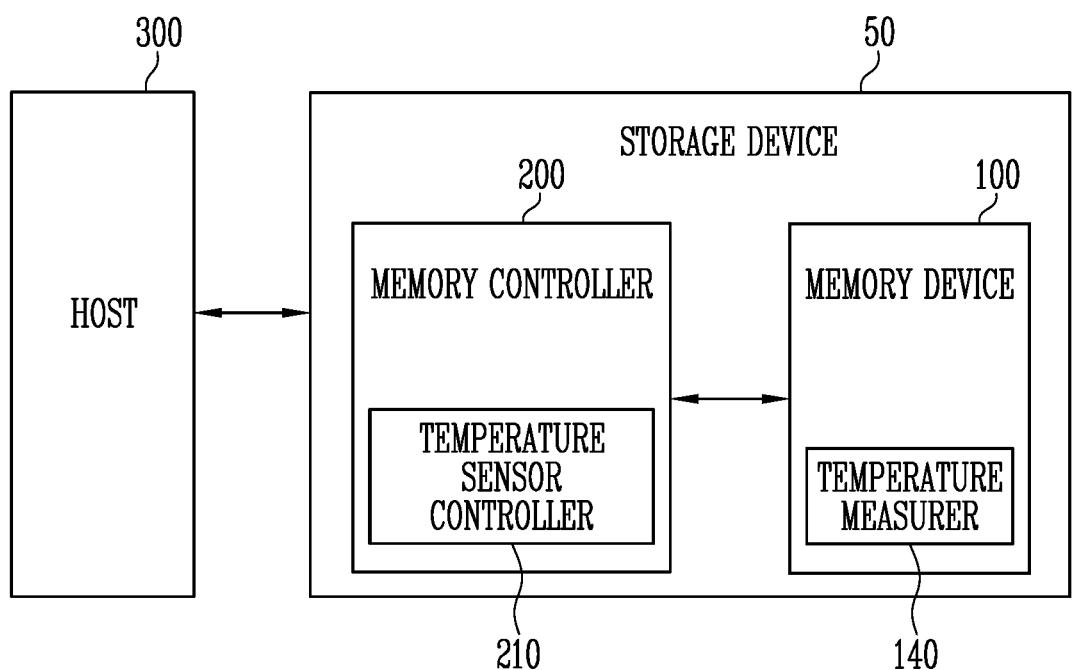
FIG. 1 is a block diagram illustrating a storage device according to an embodiment of the present disclosure.

FIG. 1 is a block diagram illustrating a storage device according to an embodiment of the present disclosure.

Referring to FIG. 1, the storage device 50 may include a memory device 100 and a memory controller 200 that controls an operation of the memory device.

The storage device 50 may store data under control of a host 300 such as a cellular phone, a smartphone, an MP3 player, a laptop computer, a desktop computer, a game player, a TV, a tablet PC, or an in-vehicle infotainment system.

The storage device 50 may be configured as any of various types of storage devices according to a host interface that is a communication method with the host 300. For example, the storage device 50 may be configured as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and/or a memory stick.

The storage device 50 may be manufactured as any of various types of packages. For example, the storage device 50 may be manufactured as a package on package (POP), a system in package (SIP), a system on chip (SOC), a multi-chip package (MCP), a chip on board (COB), a wafer-level fabricated package (WFP), and/or a wafer-level stack package (WSP).

The memory device 100 may store data. The memory device 100 operates under control of the memory controller 200. The memory device 100 may include a memory cell array including a plurality of memory cells that store data.

Each of the memory cells may be configured as a single level cell (SLC) storing one data bit, a multi-level cell (MLC) storing two data bits, a triple level cell (TLC) storing three data bits, or a quad level cell (QLC) storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. By way of example, the present invention is described in the context in which the memory device 100 is a NAND flash memory or a dynamic random access memory (dynamic RAM).

The memory device 100 may be a NAND flash memory. The memory device 100 may receive a command and an address from the memory controller 200. The memory device 100 is configured to access an area selected by the received address of the memory cell array. Accessing the selected area means performing an operation corresponding to the received command on the selected area. For example, the memory device 100 may perform a write operation (program operation), a read operation, and an erase operation. During the program operation, the memory device 100 may program data to the area selected by the address. During the read operation, the memory device 100 may read data from the area selected by the address. During the erase operation, the memory device 100 may erase data stored in the area selected by the address.

In another embodiment, the memory device 100 may be a dynamic random access memory (dynamic RAM). The memory device 100 may receive a command and an address from the memory controller 200. The memory device 100 is configured to access an area selected by the received address of the memory cell array. Accessing the selected area means performing an operation corresponding to the command received on the selected area. For example, the memory device 100 may perform a data input/output operation or a refresh operation. The data input/output operation may be an operation in which the memory device 100 receives data to store data in the area selected by the address, or outputs and reads stored data. The refresh operation may be an operation in which the memory device 100 preserves the stored data.

The memory device 100 may include a memory cell. The memory device 100 may perform an operation on the memory cell in response to the control of the memory controller 200. The operation on the memory cell may include a program operation, a read operation, and/or an erase operation. In another embodiment, the operation of the memory cell may include a data input/output operation and/or a refresh operation.

The memory controller 200 controls overall operation of the storage device 50.

When power is applied to the storage device 50, the memory controller 200 may execute firmware (FW). The firmware FW may include a host interface layer HIL that receives the request input from the host 300 or outputs a response to the host 300, a flash translation layer (FTL) that manages an operation between an interface of the host 300 and an interface of the memory device 100, and a flash interface layer (FIL) that provides a command to the memory device 100 or receive the response from the memory device 100.

In an embodiment, the memory controller 200 may receive data and a logical address (LA) from the host 300, and may convert a logical block address into a physical address (PA) indicating an address of memory cells in which data in the memory device 100 is to be stored. The LA may be a logical block address (LBA), and the PA may be a physical block address (PBA).

The memory controller 200 may control the memory device 100 to perform the program operation, the read operation, or the erase operation according to the request of the host 300. During the program operation, the memory controller 200 may provide a program command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may control the memory device 100 to perform the program operation, the read operation, or the erase operation by itself even in the absence of a request from the host 300. For example, the memory controller 200 may control the memory device 100 to perform the program operation, the read operation, or the erase operation used to perform a background operation such as wear leveling, garbage collection, or read reclaim.

In an embodiment, the memory controller 200 may include a temperature sensor controller 210. The memory device 100 may include a temperature measurer 140. The temperature sensor controller 210 may control an operation of the temperature measurer 140 in the memory device 100.

As the memory device 100 performs one or more operations (collectively, the or an operation), an internal temperature of the memory device 100 may change. The internal temperature may correspond to a temperature in or on the memory device 100. In an embodiment, the internal temperature may correspond to a temperature of the memory cell array. As the memory device 100 performs the operation more, the internal temperature of the memory device 100 may increase. When the internal temperature of the memory device 100 becomes excessively high, a possibility of deterioration of the memory device 100 increases. That is, since the probability that the operation of the memory device 100 will fail increases, performance of the memory device 100 may be deteriorated. Therefore, the memory controller 200 may measure the temperature of the memory device 100 and limit the performance of the operation of the memory device 100 to reduce the internal temperature of the memory device 100 when the internal temperature becomes excessively high. The temperature limiting the operation of the memory device 100 may be a throttling temperature. When the internal temperature of the memory device 100 is greater than the throttling temperature, the memory controller 200 may limit performance of the operation of the memory device 100. Accordingly, the internal temperature of the memory device 100 may be reduced.

In an embodiment, the memory controller 200 may differently control an operation time of the temperature measurer 140 based on a threshold value. The threshold value may mean a threshold temperature. Since the operation time of the temperature measurer 140 is controlled differently according to the measured temperature, operation performance of the memory device 100 may be improved. In detail, while the temperature measurer 140 measures the temperature, the operation of the memory device 100 may not be performed. Since a temperature sensor included in the temperature measurer 140 requires high precision, the operation of the memory device 100 may not be performed while the internal temperature is measured. Doing so while the temperature sensor is sensing temperature may result in the operation of the memory device 100 being performed abnormally. Therefore, while the internal temperature is measured, the operation may be stopped to increase reliability of the memory device 100.

In an embodiment, precision or resolution of temperature measured by the temperature measurer 140 may be controlled differently according to the temperature of the memory device 100. That is, at a relatively low temperature, the precision or resolution of the temperature represented by the temperature measurer 140 may be controlled to be relatively low. On the other hand, at a relatively high temperature, the precision or resolution of the temperature may be controlled to be relatively high. The internal temperature of the memory device 100 may be an analog value. Temperature may be expressed as a digital value, which is converted from the analog value. The precision or resolution may indicate a step size of the temperature code generated by the temperature measurer 140. A temperature code expressed at a higher resolution may represent the measured temperature of the memory device 100 more precisely. For example, when the precision or the resolution is low, a case where the actual internal temperature is 5° C. may be expressed by 0, and a case where the actual internal temperature is 10° C. may be expressed by 1. On the other hand, when the precision or the resolution is high, the case where the actual internal temperature is 5° C. may be expressed by 00, and the case where the actual internal temperature is 10° C. may be expressed by 11. In addition, when the precision or resolution is high, a temperature between 5° C. and 10° C. may also be expressed using 01 and 10 between 00 and 11. That is, as the number of bits of an output temperature code increases, the precision or resolution increases. As the precision or resolution increases, the temperature indicated by the temperature code more accurately represents the actual temperature. That is, the difference between the high precision temperature code and the actual temperature may decrease. Therefore, as the number of bits of the output temperature code increases, the difference between the actual internal temperature and the temperature indicated by the temperature code may decreases, and the temperature indicated by the temperature code may be closer to the actual internal temperature. As the precision or resolution increases, it may be more precisely determined whether or not the throttling temperature is reached.

At low temperature, a possibility of deterioration of performance of the program operation, the read operation or the erase operation of the memory device 100 may be low. According to an embodiment, the operation time of the temperature measurer 140 may be controlled to be short, thereby improving the performance of the operation of the memory device 100. That is, since a time for the temperature measurer 140 to measure the temperature is relatively short, a time during which the operation of the memory device 100 is stopped may be shortened. At low temperature, the performance of the operation of the memory device 100 may be improved. An operation mode of the temperature measurer 140 set at low temperature may be defined as a short mode.

On the other hand, at a high temperature, the possibility of the deterioration of the performance of the operation of the memory device 100 may be high. According to an embodiment, the operation time of the temperature measurer 140 is controlled to be longer to measure the temperature of the memory device 100 more precisely. That is, since the time for the temperature measurer 140 to measure the temperature is relatively long, the temperature of the memory device 100 may be more precisely measured. When the internal temperature of the memory device 100 reaches the throttling temperature, the performance of the memory device 100 is limited, and thus whether or not the internal temperature reaches the throttling temperature may be important. According to an embodiment, since the temperature measurer 140 more precisely measures the temperature at a relatively high temperature, it may be more precisely determined whether the internal temperature reaches the throttling temperature. The operation mode of the temperature measurer 140 set at the high temperature may be defined as a long mode.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and/or a load reduced DIMM (LRDIMM).

Figure 2:
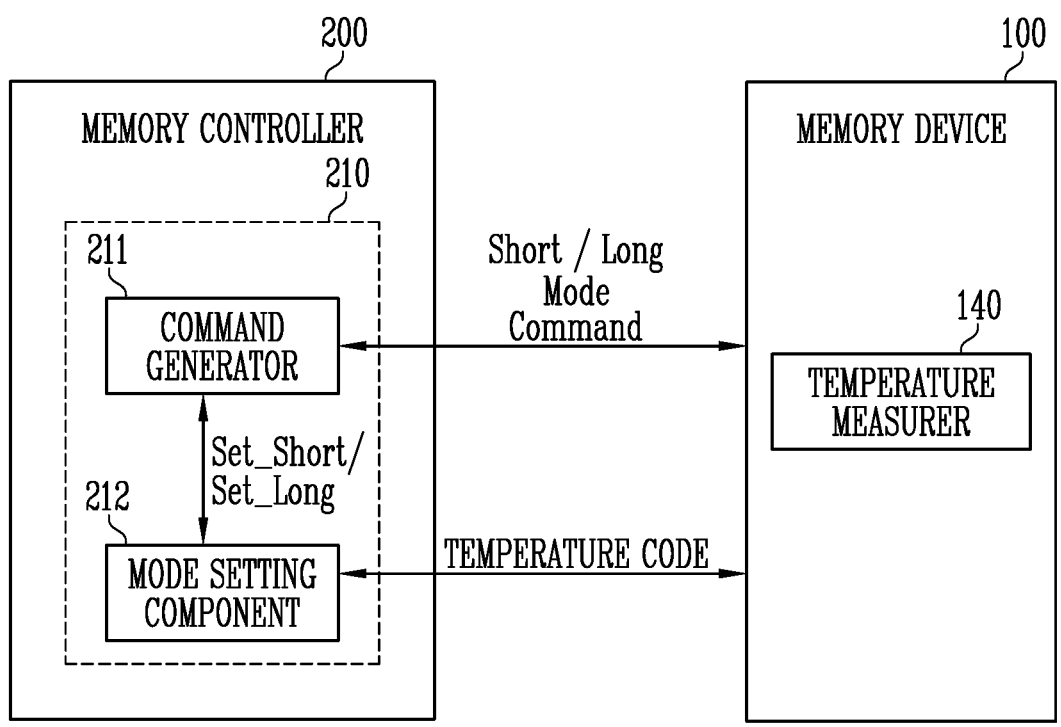
FIG. 2 is a diagram illustrating a method of operating a temperature sensor controller and a temperature measurer in detail, according to an embodiment of the present disclosure.

FIG. 2 is a diagram illustrating in detail a method of operating the temperature sensor controller and the temperature measurer according to an embodiment of the present disclosure.

Referring to FIG. 2, the memory controller 200 may include the temperature sensor controller 210. The memory device 100 may include the temperature measurer 140. The temperature sensor controller 210 may include a command generator 211 and a mode setting component 212.

The command generator 211 may generate a temperature measurement command to be provided to the memory device 100. The operation of measuring the temperature of the temperature measurer 140 may be controlled by the temperature measurement command. For example, the time required for the temperature measurer 140 to measure the temperature may be controlled according to the temperature measurement command. Alternatively, a temperature measurement period in which the temperature measurer 140 performs the operation of measuring the internal temperature may be controlled differently according to the temperature measurement command. The temperature measurement command may include a short mode command (Short Mode Command) or a long mode command (Long Mode Command). When the temperature measurement command is input to the memory device 100, the temperature measurer 140 in the memory device 100 may measure the temperature of the memory device 100. The mode setting component 212 may receive a temperature code output from the temperature measurer 140. The temperature code may be indicative of the temperature of the memory device 100 measured by the temperature measurer 140. In an embodiment, when the temperature code is less than the threshold value, the temperature measurement period of the temperature measurer 140 may be controlled to be relatively short. In another example, when the temperature code is greater than or equal to the threshold value, the temperature measurement period of the temperature measurer 140 may be controlled to be relatively long.

For example, it is assumed that the operation mode is the long mode. The memory controller 200 may provide a program, read, or erase command to the memory device 100, and the memory device 100 may perform the program operation, the read operation, or the erase operation for 1 second (s). Thereafter, when the memory controller 200 provides the temperature measurement command to the memory device 100, the temperature measurer 140 may measure the temperature of the memory device 100 for 500 microseconds (us). Thereafter, the memory device 100 may perform the operation corresponding to the program, read or erase command according to the program, read or erase command of the memory controller 200 for 1 second (s). In order to prevent performance deterioration of the memory device 100, the internal temperature is required to be continuously checked. Therefore, the operation such as the program operation, the read operation, or the erase operation of the memory device 100 and the temperature measurement operation of the memory device 100 may be repeatedly performed. The temperature measurement period described above is only an example for understanding. Other suitable temperature measuring periods may be used.

On the other hand, it is assumed that the operation mode is the short mode. When the memory controller 200 provides the temperature measurement command to the memory device 100, the temperature measurer 140 may measure the temperature of the memory device 100 for 250 microseconds (us), which is shorter than that in the long mode. A difference between the temperature measurement periods of the temperature measurer 140 in the short mode and the long mode may be 250 microseconds (us). Thus, in the short mode, the program operation, the read operation, or the erase operation of the memory device 100 may be performed for the difference of 250 microseconds (us). Therefore, in the short mode, since the memory device 100 may perform the program operation, the read operation, or the erase operation for a longer time, the operation performance of the memory device 100 may be improved. Similarly to the long mode, the internal temperature is required to be continuously checked to prevent the performance deterioration of the memory device 100. Therefore, in the manner described above, in response to a command of the memory controller 200, the operation such as the program operation, the read operation, or the erase operation of the memory device 100, and the temperature measurement operation of the memory device 100 may be repeatedly performed. The temperature measurement period described above is only an example for understanding. Other suitable temperature measuring periods may be used.

Details of the operation of the temperature sensor controller 210 are as follows. The temperature code output from the memory device 100 may be input to the mode setting component 212, which may compare the temperature code with the threshold value. In an embodiment, the temperature code may be indicative of the temperature measured by the temperature measurer 140. According to a result of comparing the temperature code with the threshold value, the mode setting component 212 may control the command generator 211 to generate the temperature measurement command to indicate that the temperature measurer 140 is to operate in the short mode or the long mode. For example, when the temperature code is less than the threshold value, the mode setting component 212 may output a short-mode-set signal (Set_short). In another example, when the input temperature code is greater than or equal to the threshold value, the mode setting component 212 may output a long-mode-set signal (Set_long). In an embodiment, the command generator 211 may receive the short-mode-set signal and generate the short mode command (Short Mode Command) corresponding thereto. On the other hand, the command generator 211 may receive the long-mode-set signal and generate the long mode command (Long Mode Command) corresponding thereto.

When the short mode command is input to the memory device 100, the temperature measurer 140 may operate in response to the short mode command. Specifically, in response to the short mode command, the temperature measurement period of the temperature measurer 140 may be shorter relative to the temperature measurement period directed by the long mode command. Since the temperature measurer 140 operates for a short time in the short mode, a temperature code of relatively low precision or resolution may be generated. For example, the number of bits of the temperature code may be relatively small. That is, since the internal temperature of the memory device 100 is relatively low, the time required for the temperature measurement period of the temperature measurer 140 may be reduced, and instead, a time used in the program operation, the read operation, or the erase operation of the memory device 100 may be increased. The performance of the program operation, the read operation, or the erase operation of the memory device 100 may be improved.

When the long mode command is input to the memory device 100, the temperature measurer 140 may operate in response to the long mode command. Specifically, in response to the long mode command, the temperature measurement period of the temperature measurer 140 may become relatively longer (compared with the temperature measurement period in the short mode). Since the temperature measurer 140 operates for a longer time, a temperature code of relatively high precision or resolution may be generated. For example, the number of bits of the temperature code may be relatively large. That is, since the internal temperature of the memory device 100 is relatively high, the time required for the temperature measurement period of the temperature measurer 140 may be increased, and as a result, the time used in the program operation, the read operation, or the erase operation of the memory device 100 may be reduced. Since the operation time of the temperature measurer 140 increases, the internal temperature of the memory device 100 may be measured more precisely. As the internal temperature is precisely measured, whether or not the throttling temperature is reached may be measured more precisely.

Figure 3:
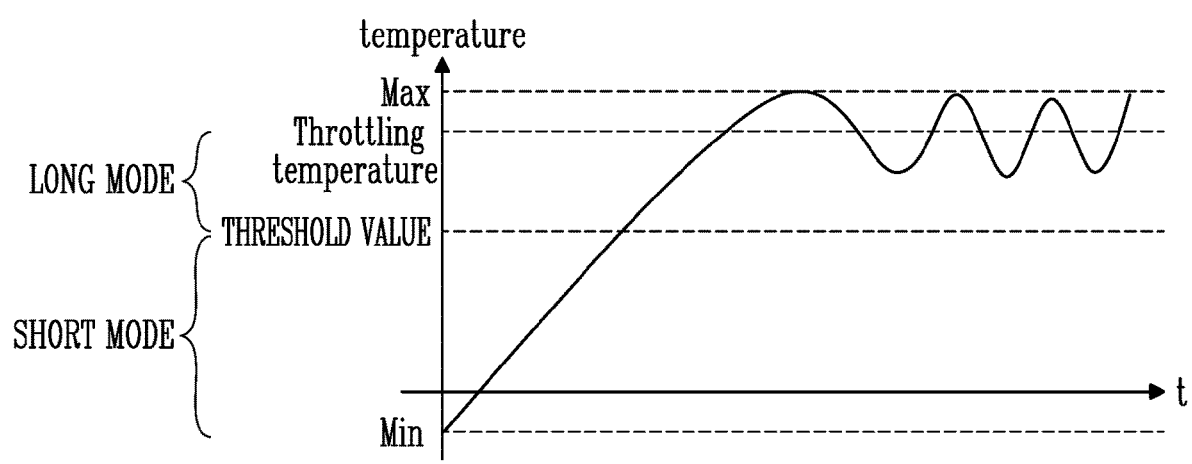
FIG. 3 is a diagram describing a short mode and a long mode of operation in detail according to an embodiment of the present disclosure.

FIG. 3 is a diagram describing the short and long modes of operation according to an embodiment of the present disclosure.

Referring to FIG. 3, as the memory device performs the program operation, the read operation, or the erase operation, the internal temperature of the memory device may change within a range defined by a minimum temperature (Min) and a maximum temperature (Max). The throttling temperature of the memory device may be lower than the maximum temperature and higher than the threshold value. The threshold value according to an embodiment may be lower than the throttling temperature and higher than the minimum temperature. The threshold value may be a temperature at which the operation mode of the temperature measurer 140 in the memory device is switched. Alternatively, the threshold value may be a reference temperature for determining the operation mode of the temperature measurer 140 included in the memory device.

When the internal temperature of the memory device reaches the throttling temperature, the memory controller may limit the operation of the memory device, which may cause the internal temperature of the memory device to decrease.

Specifically, a case where the internal temperature of the memory device is relatively low temperature is described. In an embodiment, in response to sensing that the internal temperature of the memory device is lower than the threshold value, the temperature measurer 140 in the memory device may operate in the short mode. Alternatively, when the rate of change of the internal temperature of the memory device is small, the temperature measurer 140 may operate in the short mode. On the other hand, in response to sensing that the internal temperature of the memory device is higher than the threshold value, the temperature measurer 140 in the memory device may operate in the long mode. Alternatively, when the rate of change of the internal temperature of the memory device is large, the temperature measurer 140 may operate in the long mode.

In the short mode, the temperature measurer 140 may measure the internal temperature of the memory device for a relatively short time. Thus, the program operation, the read operation, or the erase operation of the memory device may be stopped for a relatively short time. Accordingly, a time allocated to the program operation, the read operation, or the erase operation of the memory device may increase. Since the internal temperature of the memory device is measured for a relatively short time, the precision or resolution of the temperature code representing the internal temperature of the memory device may be reduced. However, the short mode is activated at a low temperature far from the throttling temperature in comparison with the long mode. Therefore, according to an embodiment, efficiency of the operation of the memory device may be increased at the expense of precision or resolution of the temperature code.

In the long mode, the temperature measurer 140 may measure the internal temperature of the memory device for a relatively long time. Thus, the program operation, the read operation, or the erase operation of the memory device may be stopped for a relatively long time. Since the internal temperature of the memory device is measured for a long time, the precision or resolution of the temperature code representing the internal temperature of the memory device may be increased. The long mode is activated at a high temperature close to the throttling temperature in comparison with the short mode. Therefore, according to an embodiment, since the precision or resolution of the temperature code indicating the internal temperature of the memory device is increased, the temperature reaching the throttling temperature may be precisely sensed.

Figure 4:
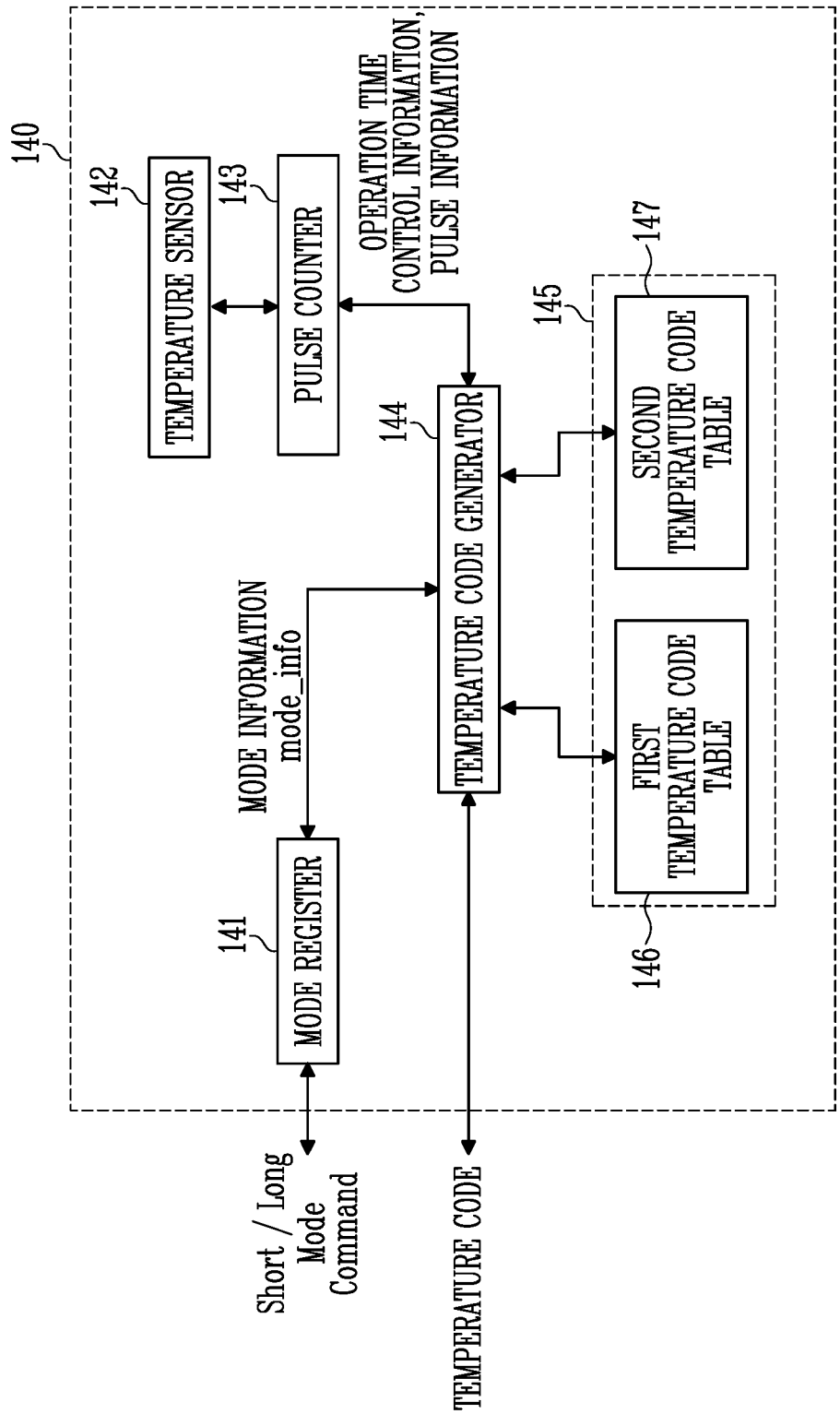
FIG. 4 is a block diagram illustrating a temperature measurer in a memory device in detail.

FIG. 4 is a block diagram describing the temperature measurer 140 in the memory device in detail.

Referring to FIG. 4, the temperature measurer 140 may include a mode register 141, a temperature sensor 142, and a pulse counter 143. Referring to FIG. 4, the temperature measurer 140 may include a temperature code generator 144 and a temperature code table 145. The temperature code table 145 may include a first temperature code table 146 and a second temperature code table 147.

The temperature measurement command may be input to the temperature measurer 140 from the command generator 211 described with reference to FIG. 2. The temperature measurement command may include at least one of the short mode command (Short Mode Command) or the long mode command (Long Mode Command).

The mode register 141 may include information indicating the temperature measurement command. Specifically, a value stored in the mode register 141 may change according to the temperature measurement command. For example, when the short mode command is input, 1 may be stored in the mode register 141. On the other hand, when the long mode command is input, 0 may be stored in the mode register 141.

The temperature sensor 142 may sense the internal temperature of the memory device. Alternatively, the temperature sensor 142 may measure the internal temperature of the memory device. The temperature sensor 142 may generate and output a pulse corresponding to the measured internal temperature. For example, the number of pulses generated may be indicative of (or proportional to) the measured internal temperature.

The pulse counter 143 may count the number of pulses received from the temperature sensor 142. An operation time of the pulse counter 143 may be controlled according to a control signal received from the temperature code generator 144. That is, the pulse counter 143 may receive operation time control information corresponding to the value stored in the mode register 141 from the temperature code generator 144. In addition, in response to the operation time control information, a time during which the pulse counter 143 counts the number of pulses may be controlled. Specifically, in the short mode, the operation time of the pulse counter 143 may be controlled so that the time for counting the pulse is relatively short. On the other hand, in the long mode, the operation time of the pulse counter 143 may be controlled so that the time for counting the pulse is relatively long. Since the time for counting the pulse is relatively short in the short mode, assuming that the same clock is used, the maximum number of pulses to be counted may be less than that of the long mode. Therefore, the precision or resolution of the pulse information output from the pulse counter in the short mode may be lower than that output in the long mode. In the short mode, the operation of the memory device may be performed for a relatively longer time. The operation of the memory device may include at least one of the program operation, the read operation, and the erase operation.

The temperature code generator 144 may control the operation time of the pulse counter 143. In addition, the temperature code generator 144 may generate the temperature code with reference to the temperature code table 145 according to the pulse information received from the pulse counter 143. The pulse information may indicate the number of pulses generated from the temperature sensor 142. Specifically, mode information (mode_info) may be input to the temperature code generator 144 according to the value stored in the mode register 141. The temperature code generator 144 may provide the operation time control information to the pulse counter 143, in correspondence with the input mode information. The operation time control information may include at least one of a first enable signal and a second enable signal. The operation time of the pulse counter 143 may be controlled in response to the operation time control information. Specifically, in response to the input of the short mode command to the mode register 141, the temperature code generator 144 may generate the first enable signal. The temperature code generator 144 may provide the first enable signal to the pulse counter 143. In response to the first enable signal, the operation time of the pulse counter 143 may be controlled so that the time during which the pulse is counted becomes relatively short. On the other hand, in response to the input of the long mode command to the mode register 141, the temperature code generator 144 may generate the second enable signal. The temperature code generator 144 may provide the second enable signal to the pulse counter 143. In response to the second enable signal, the operation time of the pulse counter 143 may be controlled so that the time during which the pulse is counted becomes relatively long. The mode information may indicate which temperature code table the temperature code generator 144 refers to among two or more temperature code tables included in the temperature code table 145. The temperature code generator 144 may receive the pulse information from the pulse counter 143, obtain a corresponding temperature code with reference to the temperature code table 145, and output the obtained temperature code to the memory controller.

For example, it is assumed that the short mode command is input to the mode register 141 from the memory controller. The temperature code generator 144 may obtain the mode information with reference to the mode register 141. The mode information may include information indicating the short mode. In addition, the temperature code generator 144 may provide the first enable signal to the pulse counter 143. The temperature sensor 142 may measure the internal temperature of the memory device. The temperature sensor 142 may generate the number of pulses corresponding to the measured internal temperature. In an embodiment, no pulse may be generated to indicate a particular measured temperature, as indicated in FIG. 7. In response to the first enable signal, the pulse counter 143 may be controlled to have a relatively short operation time. The pulse counter 143 may perform an operation of counting the number of pulses generated by the temperature sensor 142 during a short operation time. The pulse counter 143 receives a clock signal (not shown) and counts the number of pulses in response thereto, as those skilled in the art would understand. In an embodiment, assuming that a clock of the same period is input to the pulse counter 143 in the short mode and the long mode, since the number of pulses is counted during a relatively short time in the short mode, the maximum number of pulses that may be counted may be small. That is, the maximum number of pulses that may be counted during a relatively short time may be smaller than the maximum number of pulses that may be counted during a relatively long time. As the maximum number of pulses that may be counted decreases, the precision or resolution of the temperature code generated by the temperature code generator 144 may be reduced. The temperature code generator 144 may receive the pulse information and the mode information, and may refer to the first temperature code table 146 corresponding to the short mode. The temperature code generator 144 may obtain a corresponding temperature code from the first temperature code table 146 and output the corresponding temperature code.

On the other hand, it is assumed that the long mode command is input to the mode register 141 from the memory controller. The temperature code generator 144 may obtain the mode information with reference to the mode register 141. The mode information may include information indicating the long mode. In addition, the temperature code generator 144 may provide the second enable signal to the pulse counter 143. The temperature sensor 142 may measure the internal temperature of the memory device. The temperature sensor 142 may generate the number of pulses corresponding to the measured internal temperature. As in the short mode, the number of pulses may be zero, one or more, as indicated in FIG. 7. In response to the second enable signal, the pulse counter 143 may be controlled to have a relatively long operation time. The pulse counter 143 may perform an operation of counting the number of pulses generated by the temperature sensor 142 during a long operation time. In an embodiment, assuming that a clock of the same period is input to the pulse counter 143 in the short mode and the long mode, since the number of pulses is counted during a relatively long time in the long mode, the maximum number of pulses that may be counted may be greater than in the short mode. That is, the maximum number of pulses that may be counted during a relatively long time may be greater than the maximum number of pulses that may be counted during a relatively short time. As the maximum number of pulses that may be counted increases, the precision or resolution of the temperature code generated by the temperature code generator 144 may be increased. The temperature code generator 144 may receive the pulse information and the mode information and may refer to the second temperature code table 147 corresponding to the long mode. The temperature code generator 144 may obtain a corresponding temperature code from the second temperature code table 147 and output the corresponding temperature code.

Figure 5A:
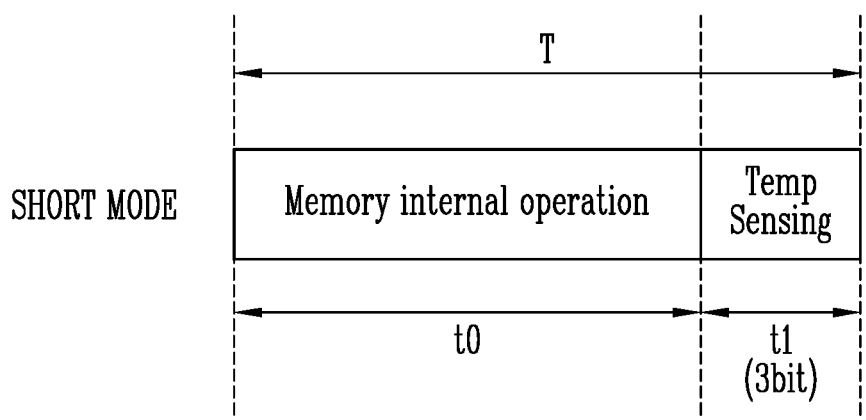
FIGS. 5A and 5B are diagrams illustrating a temperature measurement period of the temperature measurer in the short mode and the long mode, respectively.
Figure 5B:
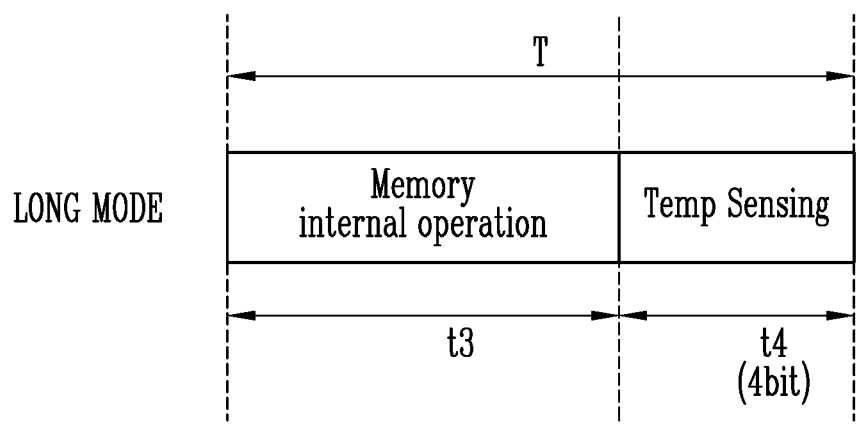

FIGS. 5A and 5B are diagrams describing the temperature measurement period of the temperature measurer 140 in the short mode and the long mode, respectively.

Referring to FIG. 5A, the short mode may include a period during which the memory device performs the operation and a period during which temperature of the memory device is measured. Specifically, the short mode may include a period t0 (of a total time T) during which the operation of the memory device is performed. During the t0 period, the memory device may perform the operation. The operation may include at least one of the program operation, the read operation, or the erase operation. In another embodiment, the operation may include at least one of the data input/output operation and the refresh operation. While the operation of the memory device is performed, the temperature measurer 140 may not perform the operation of measuring the temperature of the memory device. A period t1 may immediately follow the t0 period. In the t1 period, the temperature of the memory device may be measured in the short mode. During the t1 period, the temperature measurer 140 may measure the temperature of the memory device and output a corresponding temperature code. In the short mode, since the operation time of the temperature measurer 140 is relatively short, the number of bits of the output temperature code may be small. Therefore, a difference between a temperature value indicated by the output bit(s) and the temperature value actually measured by the temperature sensor may be greater. For example, the number of bits of the output temperature code may be 3 bits. In the short mode, the precision or resolution of the temperature code output by the temperature measurer 140 may be relatively low.

Referring to FIG. 5B, the long mode may include a period during which the operation is performed and a period during which temperature of the memory device is measured. Specifically, the long mode may include a t3 period (of a total time T) during which the operation of the memory device is performed. During the t3 period, the memory device may perform at least one of the program operation, the read operation, and the erase operation. In another embodiment, the memory device may perform at least one of the data input/output operation and the refresh operation during the t3 period. While the operation of the memory device is performed, the temperature measurer 140 may not perform the operation of measuring the temperature of the memory device. A period t4 may immediately follow the t3 period. In the t4 period, the temperature of the memory device may be measured in the long mode. During the t4 period, the temperature measurer 140 may measure the temperature of the memory device and output a corresponding temperature code. Since the operation time of the temperature measurement period is relatively long in long mode, the number of bits of the output temperature code may be great. Therefore, the difference between the temperature value indicated by the output bit(s) and the temperature value measured by the temperature sensor may be smaller. For example, the number of bits of the output temperature code may be 4 bits. In the long mode, the precision or resolution of the temperature code output by the temperature measurer 140 may be relatively high.

Referring to FIGS. 5A and 5B, in the short mode, the operation of the memory device may be performed during a relatively longer time than in the long mode, because the temperature of the memory device is measured for a relatively short time. In the short mode, since the temperature of the memory device is significantly lower than the threshold value, less time is used to measure temperature and hence more time may be used for the operation of the memory device. That is, when the temperature is higher (i.e., above the threshold) and thus control of it is a relatively high priority, temperature is measured for a longer period of time to generate a more precise temperature value, in which case there is less time available for performing the operation. However, when the temperature is lower (i.e., below the threshold), temperature is of much less concern. Hence, less time may be spent measuring temperature, leaving more time for performing the operation, and thus improving overall efficiency of the memory system. Thus, according to an embodiment, since the operation time of the temperature measurer 140 is controlled differently according to the temperature, the performance of the memory device may be improved in comparison with a case where the operation time of the temperature measurer 140 is controlled identically regardless of the temperature.

Figure 6:
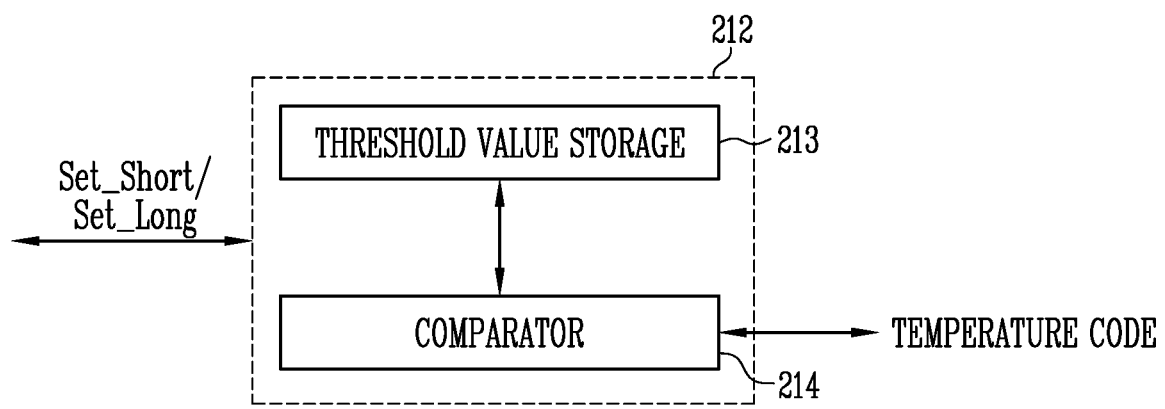
FIG. 6 is a block diagram illustrating a configuration of a mode setting component described with reference to FIG. 2.

FIG. 6 is a block diagram illustrating a configuration of the mode setting component described with reference to FIG. 2.

Referring to FIG. 6, the mode setting component 212 may include a threshold value storage 213 and a comparator 214.

The temperature code output by the temperature measurer 140 may be input to the mode setting component 212. The comparator 214 may compare the temperature code with the threshold value in the threshold storage 213. The temperature code may be a value indicating the temperature of the memory device measured by the temperature measurer 140. The threshold value may mean a threshold temperature, and may be a reference value for determining the operation mode of the temperature measurer 140.

According to a result of comparing the temperature code with the threshold value, the comparator 214 may output a signal for controlling the command generator to generate the temperature measurement command indicating which operation mode the temperature measurer 140 is to operate, e.g., the short mode or the long mode. For example, the comparator 214 may output the short-mode-set signal (Set_short) when the input temperature code is less than the threshold value. In another example, the comparator 214 may output the long-mode-set signal (Set_long) when the input temperature code is greater than or equal to the threshold value. The command generator (not shown) may receive the short-mode-set signal or the long-mode-set signal, and generate the command for determining the mode of the temperature measurer 140 in correspondence therewith.

FIG. 7 is a diagram illustrating the temperature code table.

Referring to FIG. 7, it is assumed that the threshold value is 70 as an example. In an embodiment, when the temperature code received from the memory device is less than or equal to 70, which is the threshold value, the memory controller may provide the short mode command to the memory device for setting the operation mode of the temperature measurer 140 to the short mode. The temperature measurer 140 in the memory device may receive the short mode command. The temperature sensor may measure the internal temperature of the memory device, and the pulse generator may generate the pulse in correspondence therewith. The pulse counter may count the number of generated pulses. When the pulse counter provides the pulse information corresponding to the number of pulses to the temperature code generator, the temperature code generator may generate the temperature code with reference to the first temperature code table corresponding to the short mode.

Referring to the first temperature code table shown in FIG. 7, different temperature codes (Temp Code) corresponding to different numbers of generated pulses respectively is shown. The first temperature code table may include data obtained by converting various temperatures from 50 to 67.5 into three bits. For example, during the t1 time described with reference to FIG. 5A, the temperature measurer 140 may measure the internal temperature of the memory device, and the temperature code may be generated. When the internal temperature is 50, the number of pulses generated in correspondence therewith may be zero, and 000 may be generated and output as the temperature code. When the internal temperature is 52.5, the corresponding number of pulses generated may be one, and 001 may be generated and output as the temperature code. In the same manner, when the internal temperature is 67.5, the corresponding number of pulses generated may be seven, and 111 may be generated and output as the temperature code. Referring to the first temperature code table, in the short mode, different temperature codes may be generated for each of multiple temperatures 2.5 degrees apart.

Referring to the second temperature code table shown in FIG. 7, different temperature codes corresponding to different numbers of generated pulses respectively is shown. The second temperature code table may include data obtained by converting temperatures from 70 to 88.75 into four bits. For example, during the t4 time described with reference to FIG. 5B, the temperature measurer 140 may measure the internal temperature of the memory device, and the temperature code may be generated. When the internal temperature is 70, the number of pulses generated in correspondence therewith may be zero, and 0000 may be generated and output as the temperature code. When the internal temperature is 71.25, the corresponding number of pulses generated may be one, and 0001 may be generated and output as the temperature code. In the same manner, when the internal temperature is 88.75, the corresponding number of pulses generated may be fifteen, and 1101 may be generated and output as the temperature code. Referring to the second temperature code table, in the long mode, different temperature codes may be generated for each of multiple temperatures 1.25 degrees apart.

Referring to FIG. 7, the different temperature codes may be generated at intervals of 2.5 degrees in the short mode. In contrast, the different temperature codes may be generated at intervals of 1.25 degrees in the long mode. The precision or resolution of the temperature code increases as the temperature interval is reduced. Conversely, the precision or resolution of the temperature code is reduced as the temperature interval increases.

When the precision or resolution of the temperature code is high, the temperature measurer 140 may be operated for a relatively long time, and a temperature code that may indicate a precise temperature may be output. Therefore, a temperature measurer 140 operating in the long mode at a high temperature close to the throttling temperature may be useful.

When the precision or resolution of the temperature code is low, the temperature measurer 140 operates for a relatively short time, and a temperature code that may indicate a less precise temperature may be output. However, since the program operation, the read operation, or the erase operation, which is the operation of the memory device, is stopped only for a short time, the performance of the memory device may be further improved in terms of operation efficiency of the memory device. That is, a temperature measurer 140 operating in the short mode at a low temperature relatively far from the throttling temperature advantageously allows more time for other operations.

Figure 8:
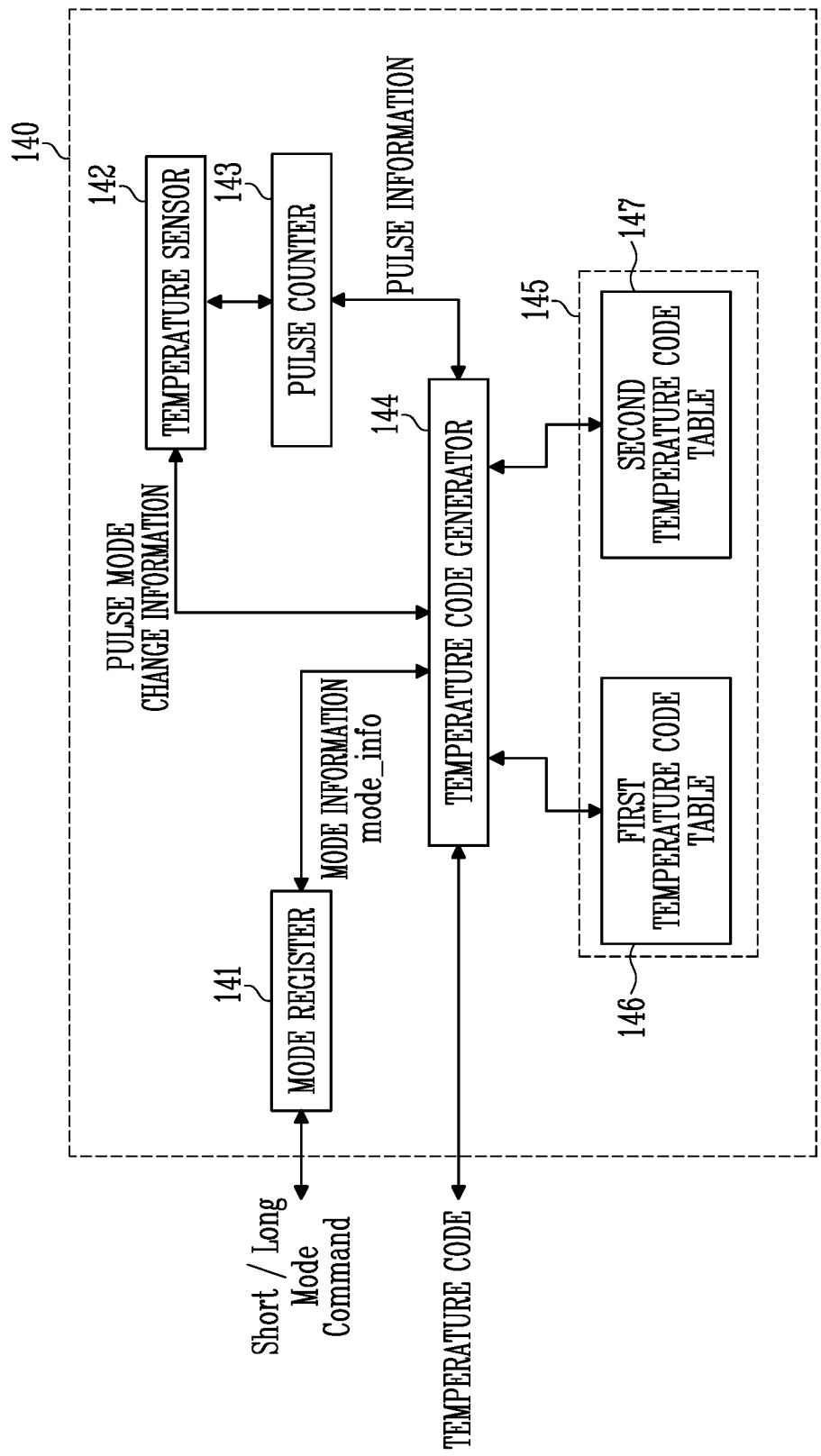
FIG. 8 is a block diagram illustrating another embodiment of a temperature measurer.

FIG. 8 is a block diagram illustrating another embodiment of the temperature measurer 140.

Referring to FIG. 8, the temperature measurer 140 may include a mode register 141, a temperature sensor 142, and a pulse counter 143. Referring to FIG. 8, the temperature measurer 140 may include a temperature code generator 144 and a temperature code table 145. The temperature code table 145 may include a first temperature code table 146 and a second temperature code table 147. The temperature measurer 140 may operate in a manner similar to that described with reference to FIG. 4. Therefore, the following description primarily focuses on the differences in configuration and operation of the temperature measurer 140 of FIG. 8 relative to that of FIG. 4.

Referring to FIG. 8, the temperature sensor 142 may generate the pulse corresponding to the measured internal temperature. For example, a pulse having different pulse widths according to the internal temperature may be generated. In addition, a pulse having different pulse widths according to the operation mode of the temperature measurer 140 may be generated.

Specifically, the temperature code generator 144 may obtain the mode information (mode_info) with reference to the mode register 141. The mode information may include information indicating the short mode or the long mode. The temperature code generator 144 may provide pulse mode change information corresponding to the mode information to the temperature sensor 142. The pulse mode change information may include a short mode temperature pulse generation signal or a long mode temperature pulse generation signal. The temperature sensor 142 may generate a short mode temperature pulse or a long mode temperature pulse in response to the pulse mode change information. The short mode temperature pulse or the long mode temperature pulse generated by the temperature sensor 142 may have a pulse width corresponding to the sensed internal temperature. Exemplary waveforms of the short mode temperature pulse and the long mode temperature pulse are described below with reference to FIGS. 9A and 9B. When the temperature sensor 142 generates the pulse corresponding to different operation modes and different internal temperatures, the pulse counter 143 may count a length of the pulse width of the generated pulse. The temperature code generator 144 may obtain a corresponding temperature code from the temperature code table 145 and provide the same to the memory controller as described with reference to FIG. 4.

Figure 9A:
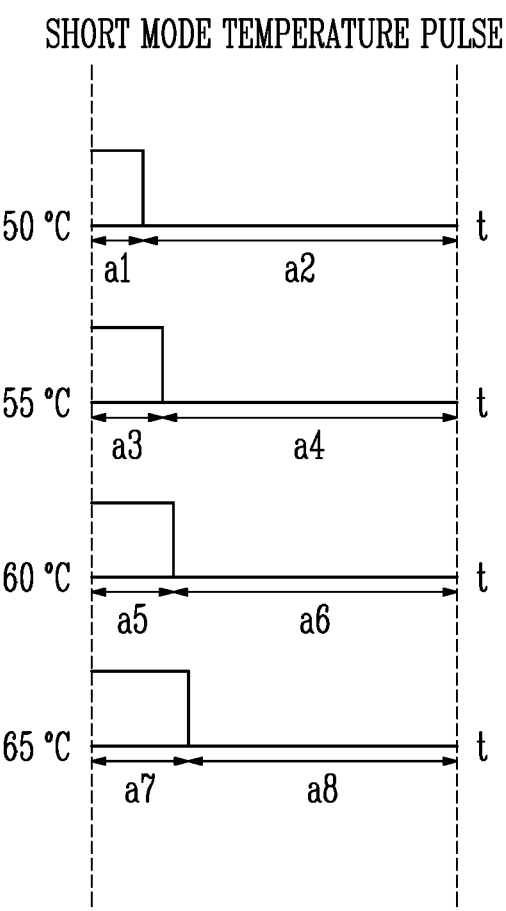
FIGS. 9A and 9B are diagrams illustrating a waveform of a pulse described with reference to FIG. 8.
Figure 9B:
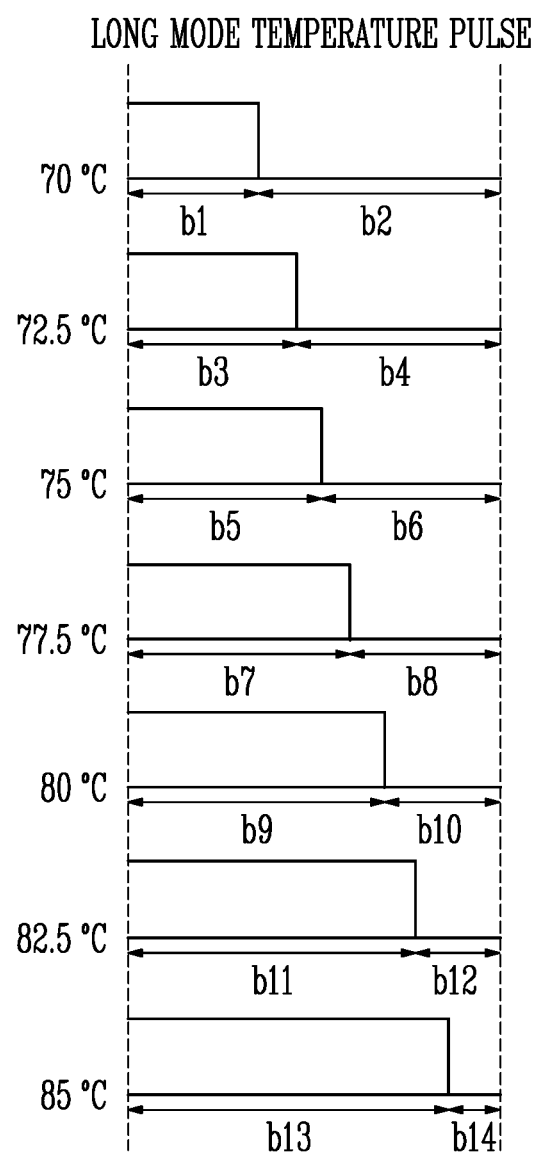

FIGS. 9A and 9B are diagrams illustrating the waveform of the pulse described with reference to FIG. 8.

The description given with reference to FIGS. 9A and 9B is in the context that the threshold value is 70. Referring to FIG. 9A, an exemplary waveform of a short mode temperature pulse is illustrated when the temperature measurer 140 operates in the short mode. When the measured internal temperature is 50° C., the pulse generator may generate a pulse in response thereto. In FIG. 9A, the logic high width of the pulse is denoted a1, and the logic low width of the pulse is denoted a2. When the measured internal temperature is 55° C., the pulse generator may generate a pulse in response thereto. The logic high width of the pulse is designated as a3, and the logic low width of the pulse is designated as a4. The other two measured temperature examples in FIG. 9A follow the same format. That is, each corresponding pulse width generated has a logic low width (denoted a5 in the case of 60° C. and a7 in the case of 65° C.) and a logic high width (denoted a6 in the case of 60° C. and a8 in the case of 65° C.). Thus, for each measured internal temperature, a pulse having a different logic high width is generated. When a length of the logic high width or the logic low width of the pulse is counted, a corresponding temperature code may be obtained.

Referring to FIG. 9B, an exemplary waveform of a long mode temperature pulse is illustrated when the temperature measurer 140 operates in the long mode. As shown in FIG. 9B different pulses for temperatures ranging from 70° C. to 85° C. at intervals of 2.5° C. are shown. Each pulse has a logic high width portion and a logic low width portion. For the Celsius temperatures 70°, 72.5°. 75°, 77.5°, 80°, 82.5° and 85° the high logic width is denoted b1, b3, b5, b7, b9, b11 and b13, respectively, and the low logic width is denoted b2, b4, b6, b8, b10, b12 and b14, respectively. Thus, each pulse has a different logic high width indicative of the corresponding measured internal temperature. When the logic high width or the logic low width of the pulse are counted, a corresponding temperature code may be obtained.

For example, in both operating modes (short and long), the internal temperature may be measured during a logic high period of the generated pulse. Referring to FIGS. 9A and 9B, the period during which the temperature sensor measures the internal temperature in the short mode may be relatively short in comparison with the long mode. Therefore, in the short mode, a temperature code having less precision but using a smaller number of bits may be output. On the other hand, the period during which the temperature sensor measures the internal temperature in the long mode may be relatively long in comparison with the short mode. Therefore, a more precise temperature code represented by more bits may be output. Referring to FIG. 9A, since the temperature code is output using a small number of bits, the difference between the represented temperature and the actual temperature may be greater than in the long mode of FIG. 9B. That is, the precision or resolution of the temperature code in the short mode, which outputs the temperature code using a smaller number of bits, may be lower than that in the long mode. In the short mode, since the period during which the temperature sensor measures the internal temperature is short, the time during which the operation of the memory device is stopped may be shortened. Therefore, in the short mode, the memory device may have improved performance. In the long mode, since the internal temperature is measured with high precision, whether the memory device reaches the throttling temperature may be precisely determined.

FIG. 10 is a flowchart describing a method of operating the memory controller according to an embodiment.

In step S1010, the memory controller may receive the temperature code output from the memory device. The temperature code may be a value indicating the temperature measured by the temperature measurer 140 included in the memory device.

In step S1020, the memory controller may compare the received temperature code with the threshold value. The threshold value may mean the threshold temperature, and may be a reference value for determining the operation mode of the temperature measurer 140. When the temperature code is less than the threshold value, the process may proceed to step S1030. When the temperature code is greater than or equal to the threshold value, the process may proceed to step S1040.

In step S1030, the memory controller may provide the short mode command (Short Mode Command) to the memory device to cause the temperature measurer 140 in the memory device to operate in the short mode.

In step S1040, the memory controller may provide the long mode command (Long Mode Command) to the memory device to cause the temperature measurer 140 in the memory device to operate in the long mode.

Figure 11:
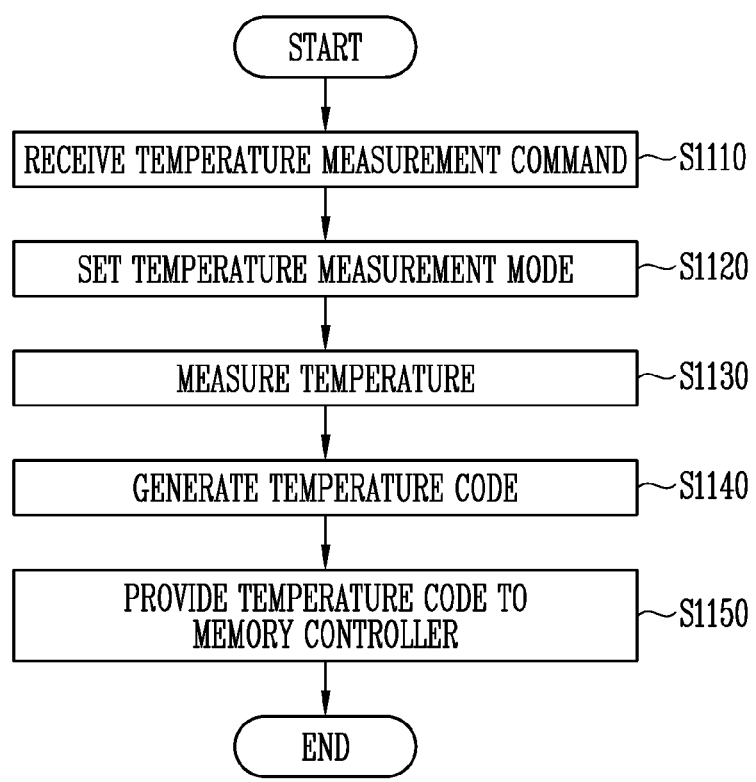
FIG. 11 is a flowchart describing a method of operating the memory device according to an embodiment of the present disclosure.

FIG. 11 is a flowchart describing a method of operating the memory device according to an embodiment.

In step S1110, the memory device may receive the temperature measurement command from the memory controller. The temperature measurement command may include the short mode command or the long mode command.

In step S1120, the temperature measurer 140 in the memory device may set the operation mode corresponding to the received temperature measurement command. The operation mode may be the short mode or the long mode.

In step S1130, the temperature measurer 140 in the memory device may measure the internal temperature of the memory device using the temperature sensor in the set operation mode. The temperature measurer 140 may generate the pulse corresponding to the internal temperature using the pulse generator.

In step S1140, the temperature code corresponding to the pulse generated from the pulse generator may be generated. That is, the pulse corresponding to the internal temperature may be generated, and the temperature code corresponding to the generated pulse may be generated. Therefore, the temperature code may be a value indicating the internal temperature measured by the temperature measurer 140 in the memory device.

In step S1150, the memory device may provide the generated temperature code to the memory controller, which may then operate as previously described. The memory controller may determine the operation mode of the temperature measurer 140 when the temperature measurement operation is performed, based on the received temperature code. That is, when providing the next temperature measurement command to the memory device, the memory controller may determine whether the temperature measurer 140 operates in the short mode or the long mode.

Figure 12:
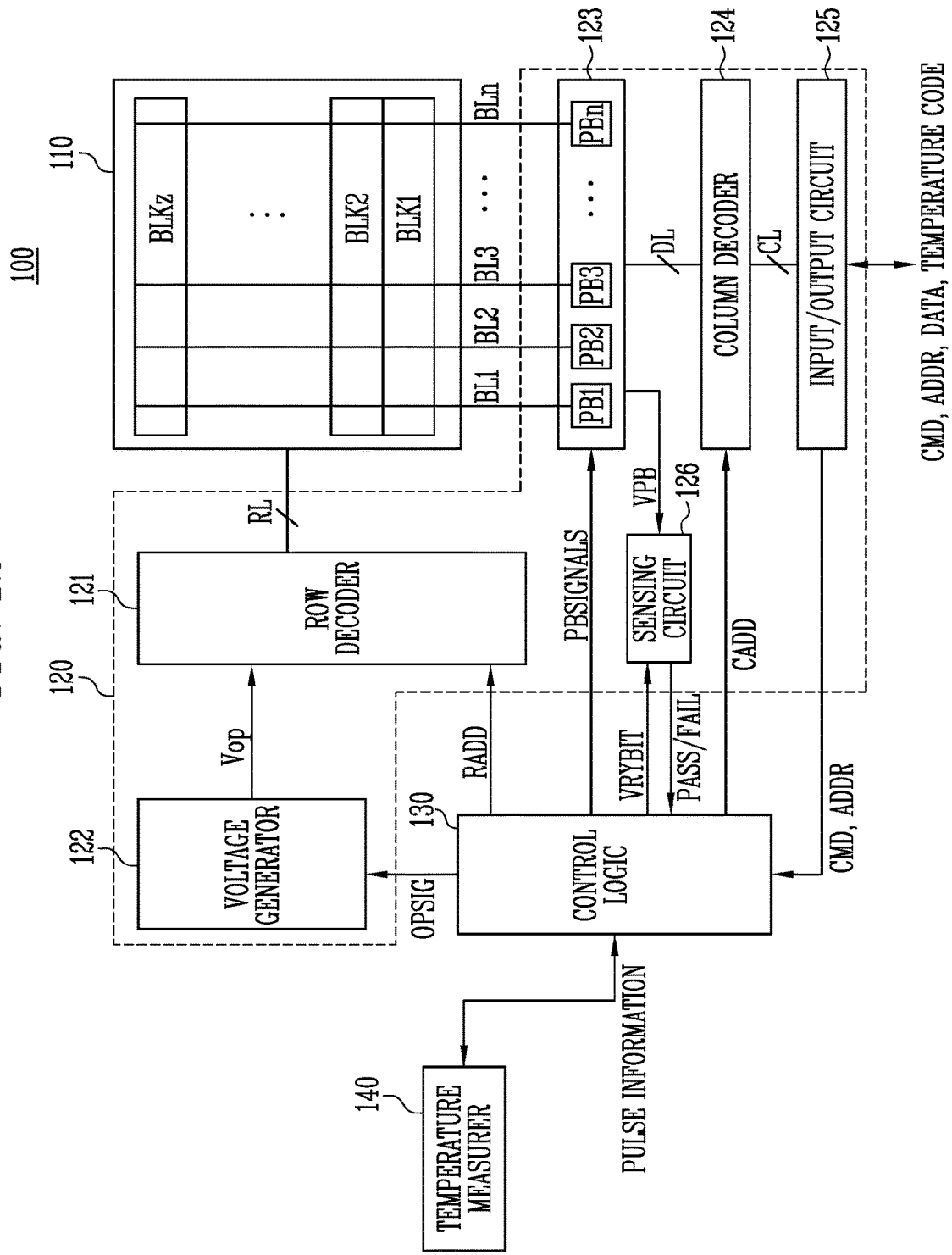
FIG. 12 is a diagram describing the memory device according to an embodiment of the present disclosure.

FIG. 12 is a diagram illustrating the memory device 100 according to an embodiment of the present disclosure.

Referring to FIG. 12, the memory device may include a memory cell array 110, a peripheral circuit 120, control logic 130, and a temperature measurer 140.

The memory cell array 110 includes a plurality of memory blocks BLK1 to BLKz. The plurality of memory blocks BLK1 to BLKz are connected to an address decoder 121 through row lines RL. The memory blocks BLK1 to BLKz may be connected to a page buffer group 123 through bit lines BL1 to BLm. Each of the plurality of memory blocks BLK1 to BLKz includes a plurality of memory cells. In an embodiment, the plurality of memory cells are non-volatile memory cells. Memory cells connected to the same word line may be defined as one page. That is, the memory cell array 110 is configured of a plurality of physical pages. Thus, one memory block may include a plurality of pages.

Each of the memory cells included in the memory cell array 110 may be configured as a single level cell (SLC) storing one data bit, a multi-level cell (MLC) storing two data bits, a triple level cell (TLC) storing three data bits, or a quad level cell (QLC) storing four data bits.

The peripheral circuit 120 may be configured to perform the program operation, the read operation, or the erase operation on a selected area of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include the address decoder 121, a voltage generator 122, the page buffer group 123, a column decoder 124, an input/output circuit 125, and a sensing circuit 126.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include at least one source select line, a plurality of word lines, and at least one drain select line. In an embodiment, the word lines may include normal word lines and dummy word lines. The row lines RL may further include a pipe select line.

The address decoder 121 is configured to operate in response to the control of the control logic 130. The address decoder 121 receives a row address RADD from the control logic 130.

The address decoder 121 is configured to decode the row address RADD. The address decoder 121 selects at least one memory block among the memory blocks BLK1 to BLKz according to a decoded address. In addition, the address decoder 121 may select at least one word line of the memory block selected to apply voltages generated by the voltage generator 122 to at least one word line WL according to the decoded address.

For example, during the program operation, the address decoder 121 may apply a program voltage to a selected word line and apply a program pass voltage of a level lower than that of the program voltage to unselected word lines. During a program verify operation, the address decoder 121 may apply a verify voltage to the selected word line and apply a verify pass voltage higher than the verify voltage to the unselected word lines. During the read operation, the address decoder 121 may apply a read voltage to the selected word line and apply a read pass voltage higher than the read voltage to the unselected word lines.

In an embodiment, the erase operation of the memory device 100 is performed in a memory block unit. During the erase operation, the address decoder 121 may select one memory block according to the decoded address. During the erase operation, the address decoder 121 may apply a ground voltage to word lines connected to the selected memory block.

The voltage generator 122 operates in response to the control of the control logic 130. The voltage generator 122 is configured to generate a plurality of voltages using an external power voltage supplied to the memory device. Specifically, the voltage generator 122 may generate various operation voltages Vop used in the program, read, and erase operations in response to operation signal OPSIG. For example, the voltage generator 122 may generate a program voltage, a verify voltage, a pass voltage, a read voltage, an erase voltage, and the like in response to the control of the control logic 130.

In an embodiment, the voltage generator 122 may generate an internal power voltage by regulating an external power voltage. The internal power voltage generated by the voltage generator 122 is used as an operation voltage of the memory device 100.

In an embodiment, the voltage generator 122 may generate a plurality of voltages using an external power voltage or an internal power voltage.

For example, the voltage generator 122 may include a plurality of pumping capacitors that receive the internal power voltage, and selectively activate the plurality of pumping capacitors in response to the control of the control logic 130 to generate the plurality of voltages.

The generated plurality of voltages may be supplied to the memory cell array 110 by the address decoder 121.

The buffer group 123 includes first to n-th page buffers PB1 to PBn, which are connected to the memory cell array 110 through the first to n-th bit lines BL1 to BLn, respectively. The first to n-th page buffers PB1 to PBn operate under the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when a program pulse is applied to the selected word line, the first to n-th page buffers PB1 to PBn may transfer data DATA, which is received through the data input/output circuit 125, to selected memory cells through the first to n-th bit lines BL1 to BLn. The memory cells of the selected page are programmed according to the transferred data DATA. A memory cell connected to a bit line to which a program permission voltage (for example, the ground voltage) is applied may have an increased threshold voltage. A threshold voltage of a memory cell connected to a bit line to which a program prohibition voltage (for example, the power voltage) is applied may be maintained. During the program verify operation, the first to n-th page buffers PB1 to PBn read page data from the selected memory cells through the first to n-th bit lines BL1 to BLn.

During the read operation, the first to n-th page buffers PB1 to PBn read the data DATA from the memory cells of a selected page through the first to n-th bit lines BL1 to BLn, and outputs the read data DATA to the data input/output circuit 125 under control of the column decoder 124.

During the erase operation, the first to n-th page buffers PB1 to PBn may float the first to n-th bit lines BL1 to BLn.

The column decoder 124 may transfer data between the input/output circuit 125 and the page buffer group 123 in response to the column address CADD. For example, the column decoder 124 may exchange data with the first to n-th page buffers PB1 to PBn through data lines DL or may exchange data with the input/output circuit 125 through column lines CL.

The input/output circuit 125 may transfer the command CMD and the address ADDR received from the memory controller 200 described with reference to FIG. 1 to the control logic 130, or may exchange the data DATA with the column decoder 124. In an embodiment, the temperature code may be transferred through the input/output circuit 125. The temperature code may indicate a value obtained by the temperature measurer 140 measuring the internal temperature of the memory device 100.

The sensing circuit 126 may generate a reference current in response to a permission bit signal VRYBIT during the read operation or the verify operation, and may compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuits 120. In addition, the control logic 130 may determine whether the verify operation is passed or failed in response to the pass or fail signal PASS or FAIL.

The temperature measurer 140 may perform the same or similar operation as that described with reference to FIGS. 1, 2, 3, and 8. Referring to FIG. 12, although the temperature measurer 140 according to an embodiment is shown as being positioned external to the control logic 130, the temperature measurer 140 may be included in the control logic 130. Details of the temperature measurer 140 are described above, and thus such details are not repeated here.

Figure 13:
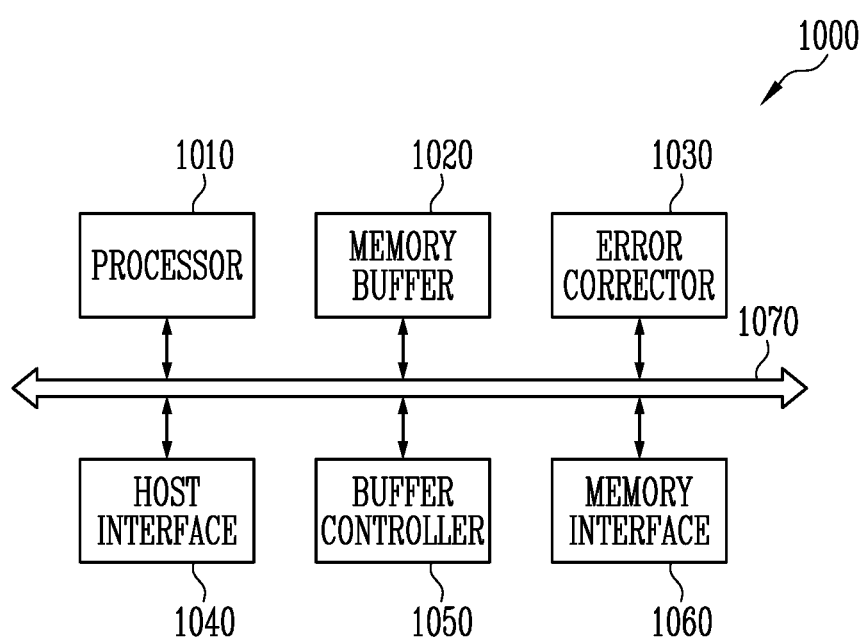
FIG. 13 is a diagram illustrating another embodiment of the memory controller of FIG. 1.

FIG. 13 is a diagram illustrating another embodiment of the memory controller of FIG. 1.

The memory controller 1000 is connected to a host (Host) and the memory device. The memory controller 1000 is configured to access the memory device in response to the request from the host.

Referring to FIG. 13, the memory controller 1000 may include a processor 1010, a memory buffer 1020, an error corrector (ECC) 1030, a host interface 1040, a buffer control circuit 1050, a memory interface 1060, and a bus 1070.

The bus 1070 may be configured to provide a channel between components of the memory controller 1000.

The processor 1010 may control overall operation of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of a flash translation layer (FTL). The processor 1010 is configured to randomize data received from the host. For example, the processor 1010 may randomize the data received from the host using a random seed. The randomized data is provided to the memory device as data to be stored and is programmed to the memory cell array.

The processor 1010 is configured to de-randomize data received from the memory device during the read operation. For example, the processor 1010 may de-randomize the data received from the memory device using a random seed. The de-randomized data may be output to the host.

In an embodiment, the processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error corrector 1030 may perform error correction. The error corrector 1030 may perform error correction encoding (ECC encoding) based on data to be written to the memory device through memory interface 1060. The error correction encoded data may be transferred to the memory device through the memory interface 1060. The error corrector 1030 may perform error correction decoding (ECC decoding) on the data received from the memory device through the memory interface 1060. For example, the error corrector 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and/or a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 may not include the memory buffer 1020 and the buffer controller 1050.

For example, the processor 1010 may control the operation of the memory controller 1000 using codes. The processor 1010 may load the codes from a non-volatile memory device (for example, a read only memory) of the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other so as not to interfere with, or affect, each other. The data bus may be connected to the host interface 1040, the buffer controller 1050, the error corrector 1030, and the memory interface 1060. The control bus may be connected to the host interface 1040, the processor 1010, the buffer controller 1050, the memory buffer 1202, and the memory interface 1060.

In an embodiment, the processor 1010 of FIG. 13 may include the temperature sensor controller 210 of FIG. 1.

Figure 14:
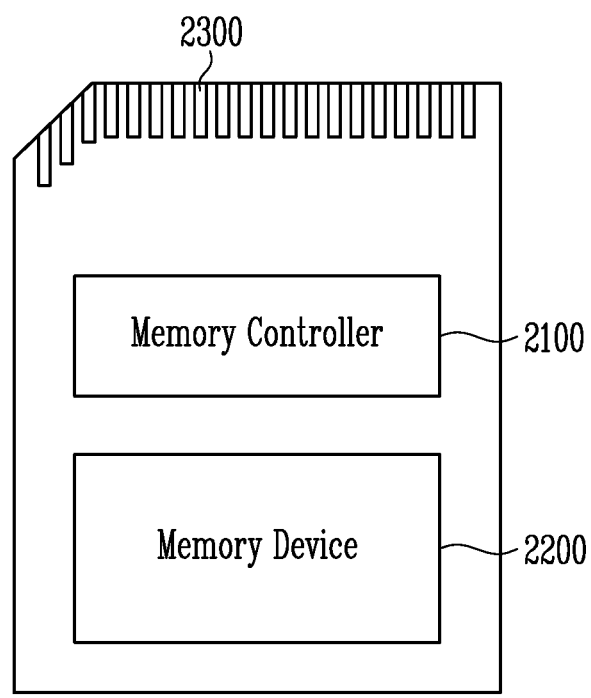
FIG. 14 is a block diagram illustrating a memory card system to which the storage device including the memory device is applied according to an embodiment of the present disclosure.

FIG. 14 is a block diagram illustrating a memory card system to which the storage device including the memory device is applied according to an embodiment of the present disclosure.

Referring to FIG. 14, the memory card system 2000 includes a memory controller 2100, a memory device 2200, and a connector 2300.

The memory controller 2100 is connected to the memory device 2200. The memory controller 2100 is configured to access the memory device 2200. The memory controller 2100 may be implemented the same or substantially the same as the memory controller 200 described with reference to FIG. 1.

For example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and/or an NVMe. For example, the connector 2300 may be defined by at least one of the various communication standards described above.

For example, the memory device 2200 may be implemented as any of various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and/or a spin-torque magnetic RAM (STT-MRAM).

For example, the memory controller 2100 or the memory device 2200 may be packaged and provided as one semiconductor package in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a thin quad flat pack (TQFP), a system in package (SIP), a multi-chip package (MCP), a wafer-level fabricated package (WFP), or a wafer-level processed stack package (WSP). Alternatively, the memory device 2200 may include a plurality of non-volatile memory chips, which may be packaged and provided as one semiconductor package based on any of the above-described package methods.

For example, the memory controller 2100 and the memory device 2200 may be integrated into one semiconductor device. For example, the memory controller 2100 and the memory device 2200 may be integrated into one semiconductor device to configure a solid state drive (SSD). In another embodiment, the memory controller 2100 and the memory device 2200 may be integrated into one semiconductor device to configure a memory card, such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and/or a universal flash storage (UFS).

For example, the memory device 2200 may be configured the same or substantially the same as the memory device 100 described with reference to FIG. 1.

Figure 15:
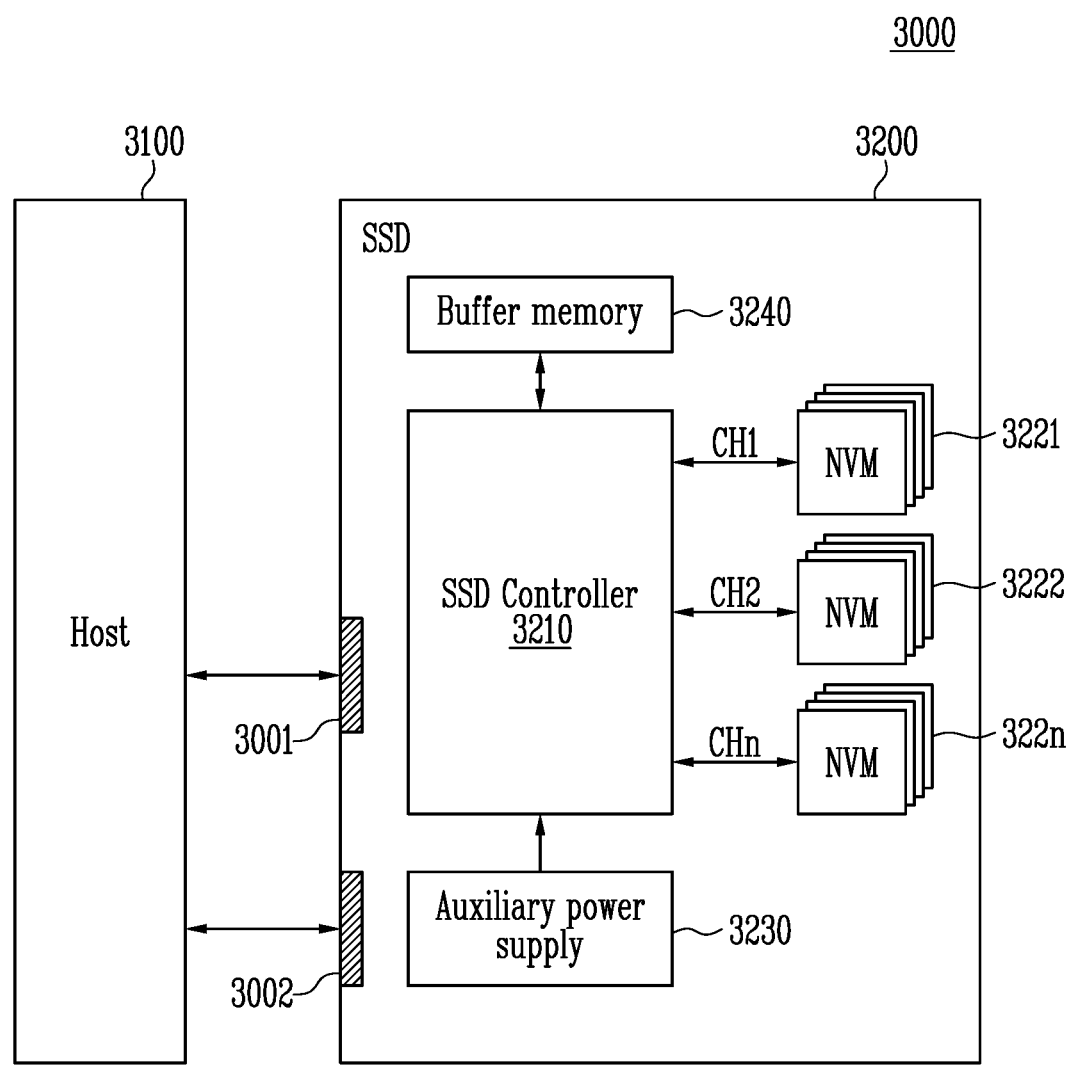
FIG. 15 is a block diagram illustrating a solid state drive (SSD) system to which the storage device including the memory device is applied according to an embodiment of the present disclosure.

FIG. 15 is a block diagram illustrating a solid state drive (SSD) system to which the storage device including the memory device is applied according to an embodiment of the present disclosure.

Referring to FIG. 15, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform the function of the memory controller 200 described with reference to FIG. 1.

The SSD controller 3210 may control the plurality of flash memories 3221 to 322n in response to the signal SIG received from the host 3100. For example, the signal SIG may be signals based on an interface between the host 3100 and the SSD 3200. For example, the signal SIG may be defined by at least one of various interfaces such as a universal serial bus (USB), a multimedia card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and/or an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. For example, the auxiliary power device 3230 may be positioned in, or external to, the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

For example, the non-volatile memories 3321 to 322n may be configured the same or substantially the same as the memory device 100 described with reference to FIG. 2.

Figure 16:
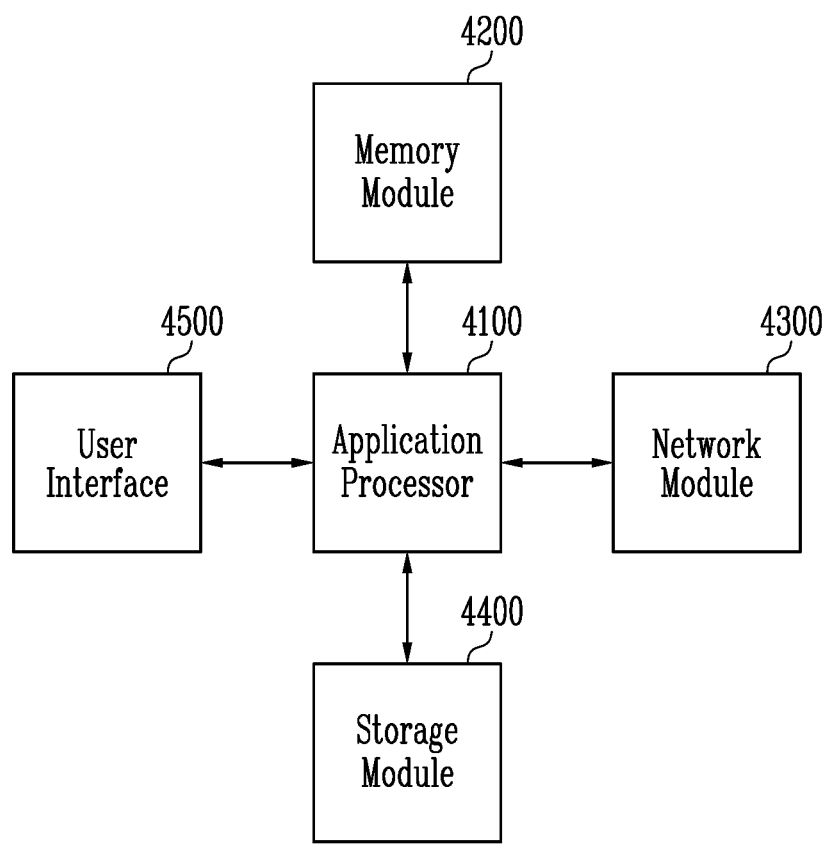
FIG. 16 is a block diagram illustrating a user system to which the storage device including the memory device is applied according to an embodiment of the present disclosure.

FIG. 16 is a block diagram illustrating a user system to which the storage device including the memory device is applied according to an embodiment of the present disclosure.

Referring to FIG. 16, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may be configured the same or substantially the same as the memory device 100 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

Embodiments of the present disclosure, provide a temperature measurer with a temperature sensor capable of operating in different modes to provide different levels of precision in measuring temperature of a device to reduce performance degradation of a system including the device.

While various embodiments of the present invention have been illustrated and described, it will be understood by those skilled in the art in light of the present disclosure that the disclosed embodiments are examples only. Accordingly, the present invention is not limited to or by any of the disclosed embodiments. Rather, the present invention encompasses all modifications and variations of any of the disclosed embodiments to the extent such modifications and variations fall within the scope of the claims.

What is claimed is:

1. A semiconductor system comprising:
   a semiconductor device configured to output a temperature code corresponding to an internal temperature thereof; and
   a controller configured to control, based on the temperature code, the semiconductor device to set a temperature measurement mode among at least two temperature measurement modes having different required times each for measuring the internal temperature and to measure the internal temperature in the set temperature measurement mode.

2. The semiconductor system of claim 1, wherein the controller comprises:
   a command generator configured to generate a temperature measurement command for controlling the semiconductor device to measure the internal temperature; and
   a mode setting component configured to receive the temperature code from the semiconductor device and control an operation of the command generator according to the temperature code.

3. The semiconductor system of claim 2, wherein the mode setting component comprises:
   a threshold value storage configured to store a threshold value; and
   a comparator configured to compare the threshold value with the temperature code to output a signal indicating whether the temperature code is less than the threshold value.

4. The semiconductor system of claim 1, wherein the semiconductor device comprises:
   a temperature sensor configured to measure the internal temperature and generate at least one pulse corresponding to the internal temperature;
   a pulse counter configured to count the at least one pulse to generate and output pulse information; and
   a temperature code generator configured to receive a temperature measurement command indicating the set temperature measurement mode from the controller, and generate the temperature code based on the pulse information in response to the temperature measurement command.

5. The semiconductor system of claim 4, wherein the semiconductor device further comprises a mode register configured to store a value corresponding to the temperature measurement command.

6. The semiconductor system of claim 5,
   wherein the semiconductor device further comprises a first temperature code table and a second temperature code table, and
   wherein the temperature code generator generates the temperature code by referring to the first temperature code table or the second temperature code table according to the pulse information and the value stored in the mode register.

7. The semiconductor system of claim 6, wherein the first temperature code table or the second temperature code table includes at least one temperature code corresponding to the pulse information.

8. The semiconductor system of claim 5, wherein the pulse information includes the number of pulses output from the pulse counter.

9. The semiconductor system of claim 5, wherein the pulse information includes a width of the pulse output from the pulse counter.

10. The semiconductor system of claim 1,
wherein the at least two temperature measurement modes include a short mode and a long mode, and
wherein a time required for measuring the internal temperature of the short mode is shorter than a time required for measuring the internal temperature of the long mode.

11. The semiconductor system of claim 10, wherein the short mode is set to represent the temperature code with a lesser number of bits than the number of bits of the long mode.

12. The semiconductor system of claim 10, wherein the controller controls the semiconductor device to set the short mode at a temperature lower than a temperature at which the long mode is set.

13. The semiconductor system of claim 10,
wherein the controller controls the semiconductor device to set the short mode in a first temperature range and to set the long mode in a second temperature range, and
wherein the first temperature range is lower than the second temperature range.

14. A storage device comprising:
a memory device including a memory cell that stores data and configured to perform an operation on the memory cell; and
a memory controller configured to control a length of a first period during which the operation is performed and a length of a second period during which a temperature measurement operation of measuring an internal temperature of the memory device is performed based on the internal temperature of the memory device,
wherein the memory controller sets a mode of the temperature measurement operation among at least two modes having different required times each for measuring the internal temperature, and
wherein the memory device performs the temperature measurement operation in the mode.

15. The storage device of claim 14,
wherein the memory device comprises a temperature measurer configured to perform the temperature measurement operation in a short mode or a long mode,
wherein each of the short mode and the long mode includes the first period and the second period, and
wherein the length of the second period in the short mode is shorter than the length of the second period in the long mode.

16. The storage device of claim 14, wherein the operation includes at least one of a program operation, a read operation, and an erase operation.

17. The storage device of claim 14, wherein the operation includes at least one of an input/output operation of the data and a refresh operation.

18. The storage device of claim 15, wherein the temperature measurer performs the measurement in the short mode when a temperature code generated as a result of performing the temperature measurement operation is less than a threshold value.

19. The storage device of claim 18, wherein the temperature code includes a value corresponding to the internal temperature.

20. The storage device of claim 15, wherein the temperature measurer performs the temperature measurement operation in the short mode at a temperature lower than a temperature at which the temperature measurer performs the temperature measurement operation in the long mode.

21. A memory device comprising:
a memory cell array; and
a temperature sensor configured to measure an internal temperature of the memory cell array and generate at least one pulse corresponding to the internal temperature;
a pulse counter configured to evaluate the pulse and output pulse information corresponding thereto;
a temperature code generator configured to generate a temperature code corresponding to the pulse information; and
a mode register indicating an operation mode of the temperature sensor,
wherein the operation mode includes a short mode in which an operation time of the pulse counter is relatively short and a long mode in which the operation time of the pulse counter is relatively long, and
wherein the pulse counter counts the at least one pulse or measures a width of the pulse.

22. The memory device of claim 21, wherein the temperature sensor operates in the short mode when the internal temperature is relatively low, and operates in the long mode when the internal temperature is relatively high.

23. An operating method of a memory system including a controller and a memory device, the operating method comprising:
providing, by the memory device, the controller with information of a current temperature of the memory device;
determining, by the controller, a subsequent temperature sensing mode among at least two subsequent temperature sensing modes having different required times each for sensing a subsequent temperature of the memory device based on the current temperature; and
controlling, by the controller, the memory device to sense the subsequent temperature of the memory device in the determined subsequent temperature sensing mode.

* * * * *